(12) United States Patent
Ito

(10) Patent No.: US 7,585,058 B2
(45) Date of Patent: Sep. 8, 2009

(54) INK-JET HEAD

(75) Inventor: Koji Ito, Gifu (JP)

(73) Assignee: Brother Kogyo Kabushiki Kaisha, Nagoya-shi, Aichi-ken (JP)

( * ) Notice: Subject to any disclaimer, the term of this patent is extended or adjusted under 35 U.S.C. 154(b) by 379 days.

(21) Appl. No.: 11/626,300

(22) Filed: Jan. 23, 2007

(65) Prior Publication Data

US 2007/0222822 A1 Sep. 27, 2007

(30) Foreign Application Priority Data

Jan. 24, 2006 (JP) ............................. 2006-014515

(51) Int. Cl.
*B41J 2/045* (2006.01)
(52) U.S. Cl. ...................................... 347/68
(58) Field of Classification Search .................. 347/68, 347/69–72, 57; 400/124.16
See application file for complete search history.

(56) References Cited

U.S. PATENT DOCUMENTS 6,334,668 B1 * 1/2002 Isamoto ........................ 347/57

FOREIGN PATENT DOCUMENTS

JP 2005-193497 A 7/2005

\* cited by examiner

*Primary Examiner*—K. Feggins
(74) *Attorney, Agent, or Firm*—Baker Botts L.L.P.

(57) ABSTRACT

An ink-jet head includes a passage unit, a piezoelectric actuator, a first wire member, and a second wire member. The first wire member is connected to the piezoelectric actuator and has a driver IC. The second wire member is connected to the first wire member and has wires. The first wire member includes signal wires, the driver IC, a circuit component that electrically connects two or more of the signal wires, and first contacts connected to the respective signal wires. The second wire member includes the wires, and second contacts connected to the respective wires. The corresponding first and second contacts are connected to each other at and around a portion where the first wire member and the second wire member overlap. The circuit component is disposed near any of the first contacts. All of the first and second contacts, and the circuit component are covered with an insulating tape.

5 Claims, 7 Drawing Sheets

INK-JET HEAD

CROSS-REFERENCE TO RELATED APPLICATION

This application claims priority to and the benefit of Japanese Patent Application No. 2006-014515 filed on Jan. 24, 2006, the disclosure of which is incorporated herein by reference.

BACKGROUND OF THE INVENTION

1. Field of the Invention

The present invention relates to an ink-jet head that ejects ink from an ink ejection port.

2. Description of Related Art

A known ink-jet head uses a piezoelectric actuator for applying pressure to ink contained in a pressure chamber that communicates with an ink ejection port, so that ink is ejected from the ink ejection port. In a certain ink-jet head of this type, a drive signal is given to the piezoelectric actuator through a wire connected to the piezoelectric actuator. For example, Japanese Patent Unexamined Publication No. 2005-193497 discloses an ink-jet head that adopts, as a flexible wire board, a COF (Chip On Film) on a surface of which a driver IC having a drive circuit therein is mounted. One end of the COF is connected to an upper face of the piezoelectric actuator, and the other end thereof is connected to a printed board.

SUMMARY OF THE INVENTION

The COF is expensive, however. The ink-jet head disclosed in the above-mentioned document requires a long COF in order to connect the piezoelectric actuator to the printed board. Manufacturing costs of the ink-jet head is increased accordingly.

An object of the present invention is to provide an ink-jet head in which a piezoelectric actuator, a driver IC, and a printed board can be connected while manufacturing costs are suppressed.

According to an aspect of the present invention, there is provided an ink-jet head comprising a passage unit, a piezoelectric actuator, a first wire member, and a second wire member. The passage unit has a pressure chamber that communicates with an ink ejection port. The piezoelectric actuator applies pressure to ink in the pressure chamber, and has a piezoelectric member including one or more piezoelectric layers, an individual electrode formed corresponding to the pressure chamber, and a common electrode formed corresponding to the individual electrode. At least one piezoelectric layer is sandwiched between the individual electrode and the common electrode. The first wire member is connected to the piezoelectric actuator and has a driver IC that supplies a drive potential to the piezoelectric actuator. The second wire member is connected to the first wire member and has a plurality of supply wires including a control signal supply wire that supplies a control signal to the driver IC. The first wire member includes a first substrate, a plurality of signal wires, the driver IC connected to the signal wires, a circuit component that electrically connects two or more of the signal wires and has its conductive part exposed, and a plurality of first contacts connected to the respective signal wires. The second wire member includes a second substrate, the supply wires, and a plurality of second contacts connected to the respective supply wires. The corresponding first and second contacts are connected to each other. The circuit component is disposed near any of the first contacts. All of the first and second contacts, and the circuit component are covered with an insulating tape.

In the aspect, the inexpensive second wire member such as an FPC (Flexible Printed Circuit) not mounted with the driver IC is connected to the expensive first wire member such as a COF mounted with the driver IC. In this case, by connecting the second wire member to a printed board, a length of the first wire member can be shortened. Manufacturing costs of the ink-jet head can thereby be suppressed.

BRIEF DESCRIPTION OF THE DRAWINGS

Other and further objects, features and advantages of the invention will appear more fully from the following description taken in connection with the accompanying drawings in which.

DESCRIPTION OF THE PREFERRED EMBODIMENTS

In the following, a certain preferred embodiment of the present invention will be described with reference to the accompanying drawings.

Figure 1:
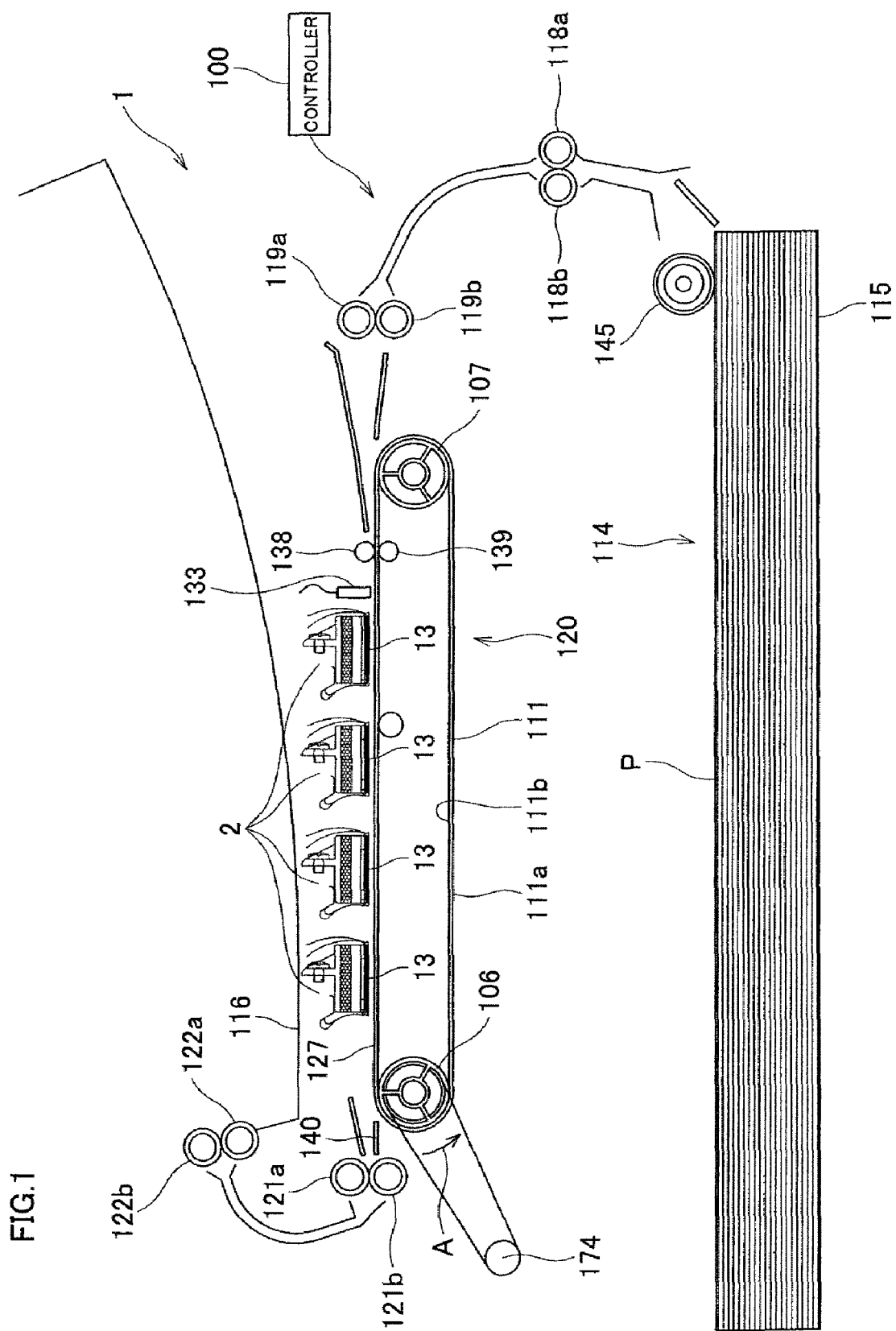
FIG. 1 schematically illustrates a construction of an ink-jet printer according to an embodiment of the present invention.

FIG. 1 schematically illustrates a construction of an ink-jet printer 1 according to an embodiment of the present invention. The printer 1 is a color ink-jet printer of line type having four fixed ink-jet heads 2. The printer 1 includes a paper feed unit 114, a paper receiving tray 116, and a conveyance unit 120, which are shown in lower, upper, and middle parts of FIG. 1, respectively. The printer 1 also includes a controller 100 that controls operations of the paper feed unit 114, the paper receiving tray 116, and the conveyance unit 120.

The paper feed unit 114 has a paper holder 115 and a paper feed roller 145. A stack of printing papers P of rectangular shape are held in the paper holder 115. The paper feed roller 145 sends out to the conveyance unit 120 an uppermost one of the printing papers P held in the paper holder 115 one by one. The paper holder 115 holds a printing paper P in such a manner that the printing paper P is sent out in a direction along its longer side. Between the paper feed unit 114 and the conveyance unit 120, two pairs of feed rollers 118a and 118b, and 119a and 119b are disposed along a conveyance path of the paper P. A printing paper P sent out from the paper feed unit 114 is, while being led by one shorter side thereof, sent upward in FIG. 1 by the feed rollers 118a and 118b. Then, by the feed rollers 119a and 119b, the printing paper P is sent toward the conveyance unit 120.

The conveyance unit 120 has an endless conveyor belt 111, and two belt rollers 106 and 107 on which the conveyor belt 111 is wound. A length of the conveyor belt 111 is adjusted in such a manner that a predetermined tension occurs in the conveyor belt 111. The conveyor belt 111, which is wound on the two belt rollers 106 and 107, defines two parallel planes each including a tangent line that is common to the belt rollers 106 and 107. Of these two planes, the one opposed to the ink-jet heads 2 forms a conveyor face 127 for the printing paper P. A printing paper P sent out of the paper feed unit 114 is conveyed on the conveyor face 127, and in this condition the ink-jet heads 2 perform printing on an upper face of the printing paper P. Then, the printing paper P reaches the paper receiving tray 116. Printing papers P thus printed are piled in the paper receiving tray 116.

Figure 2:
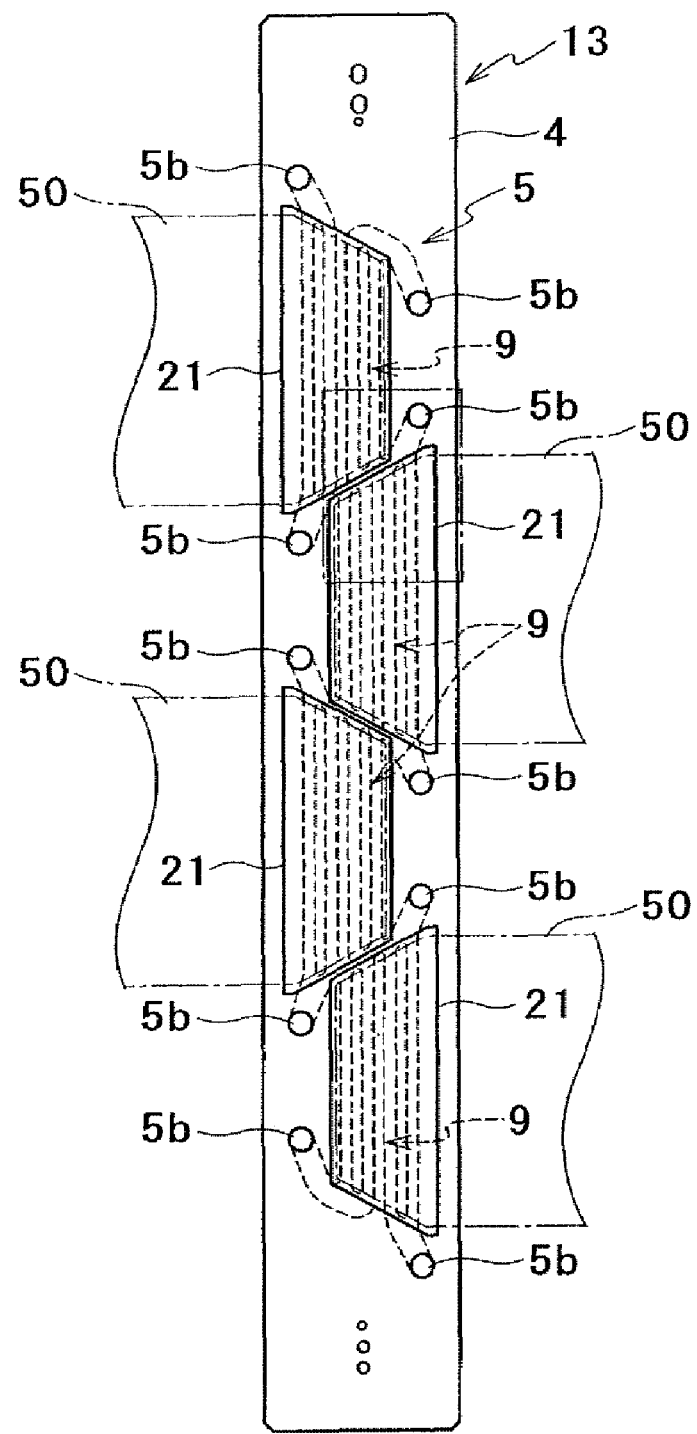
FIG. 2 is a plan view of a head main body that is included in the ink-jet printer illustrated in FIG. 1.

Each of the four ink-jet heads 2 has a head main body 13 at its lower end. The head main body 13 includes a passage unit 4 having individual ink passages 32 formed therein (see FIG. 4), and four piezoelectric actuators 21 bonded to an upper face of the passage unit 4 with an adhesive. Each of the individual ink passages 32 has one nozzle 8 and one pressure chamber 10. The nozzle 8 has an ink ejection port formed at an end thereof. The pressure chamber 10 communicates with the nozzle 8. The piezoelectric actuator 21 applies pressure to ink contained in a desired pressure chamber 10. As shown in FIG. 2, a COF 50 is bonded to each piezoelectric actuator 21, and supplies a printing signal to the piezoelectric actuator 21.

Figure 3:
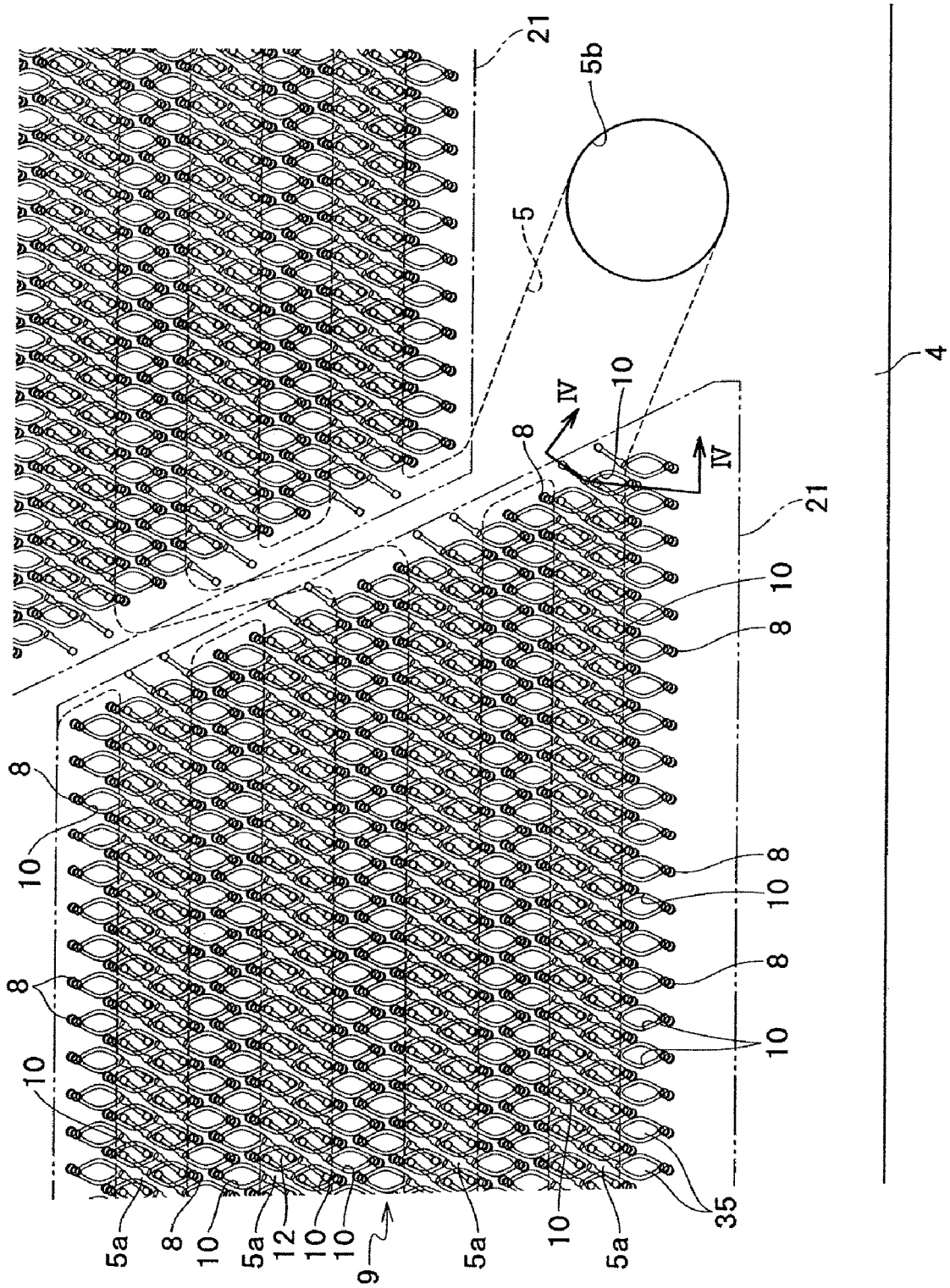
FIG. 3 shows on an enlarged scale a part enclosed with an alternate long and short dash line in FIG. 2.

Each of the head main body 13 has a rectangular parallelepiped shape (see FIG. 2) elongated in a direction perpendicularly crossing the drawing sheet of FIG. 1. The head main bodies 13 are arranged adjacent to each other along a horizontal direction of the drawing sheet of FIG. 1. Each of the head main bodies 13 has, on its bottom face, many small-diameter nozzles 8, as shown in FIG. 3. A color of ink ejected from a nozzle 8 is any of magenta, yellow, cyan, and black. Nozzles 8 included in one head main body 13 eject ink of the same color. The four head main bodies 13 eject ink of four different colors of magenta, yellow, cyan, and black, respectively.

A narrow space is formed between the bottom faces of the head main bodies 13 and the conveyor face 127 of the conveyor belt 111. A conveyance path is formed through the space, and a printing paper P is conveyed along the conveyance path from right to left in FIG. 1. While the printing paper P sequentially passes under the four head main bodies 13, ink is ejected from the nozzles 8 toward an upper face of the printing paper P in accordance with image data, so that a desired colored image is formed on the printing paper P.

The belt rollers 106 and 107 are in contact with an inner surface 111b of the conveyor belt 111. The belt roller 106 is connected to a conveyor motor 174. The conveyor motor 174 is driven in rotation under control of the controller 100. The belt roller 107 is a slave roller rotated by rotational force that is supplied from the conveyor belt 111 as the belt roller 106 rotates in an arrow A direction.

A nip roller 138 and a nip bearing roller 139 are disposed near the belt roller 107, so as to sandwich the conveyor belt 111 therebetween. The nip roller 138 is biased downward by an unillustrated spring, in order to press, to the conveyor face 127, the printing paper P supplied to the conveyance unit 120. The printing paper P as well as the conveyor belt 111 is nipped between the nip roller 138 and the nip bearing roller 139. Since an outer surface of the conveyor belt 111 is treated with adherent silicone rubber, the printing paper P securely adheres to the conveyor face 127.

As shown in FIG. 1, a peeling plate 140 is provided on a left side of the conveyance unit 120. A right end of the peeling plate 140 goes into between the printing paper P and the conveyor belt 111, thereby peeling the printing paper P, which adheres to the conveyor face 127 of the conveyor belt 111, from the conveyor face 127.

Two pairs of feed rollers 121a and 121b, and 122a and 122b are disposed between the conveyance unit 120 and the paper receiving tray 116. The printing paper P discharged from the conveyance unit 120 is, while being led by one shorter side thereof, sent upward in FIG. 1 by the feed rollers 121a and 121b. Then, the printing paper P is sent to the paper receiving tray 116 by the feed rollers 122a and 122b.

A paper sensor 133 is disposed between the nip roller 138 and the most upstream one of the ink-jet heads 2. The paper sensor 133 is an optical sensor including a light emitting body and a light receiving body, and detects a position of a leading edge of the printing paper P on the conveyance path.

Next, details of the head main body 13 will be described. FIG. 2 is a plan view of the head main body 13 illustrated in FIG. 1. FIG. 3 shows on an enlarged scale a part enclosed with an alternate long and short dash line in FIG. 2. In FIG. 2, for the purpose of explanatory convenience, the COFs 50 are illustrated with alternate long and two short dashes lines though they are disposed on an uppermost face, whereas the piezoelectric actuators 21 are illustrated with solid lines though they are disposed under the COFs 50. As shown in FIG. 2, the piezoelectric actuators 21 each having a trapezoidal shape are arranged in two rows and in a zigzag pattern on the upper face of the passage unit 4. To be more specific, each of the piezoelectric actuators 21 is disposed with its parallel opposed sides, which mean upper and lower sides, extending along a longitudinal direction of the passage unit 4. Oblique sides of every neighboring piezoelectric actuators 21 partially overlap each other with respect to a widthwise direction of the passage unit 4.

Regions of a lower face of the passage unit 4 corresponding to where the piezoelectric actuators 21 are bonded define ink ejection regions. As shown in FIG. 3, many ink ejection ports 8 are regularly arranged on a surface of the ink ejection regions. On the upper face of the passage unit 4, many pressure chambers 10 are arranged in a matrix. On the upper face of the passage unit 4, one pressure chamber group 9 is made up of many pressure chambers 10 existing within a region opposed to where one piezoelectric actuator 21 is bonded. As will be described later, individual electrodes 35 formed on the piezoelectric actuator 21 are opposed to the respective pressure chambers 10. In this embodiment, with respect to the widthwise direction of the passage unit 4, sixteen rows of pressure chambers 10 are formed in parallel to each other. In each of the rows, the pressure chambers 10 are arranged at regular intervals in the longitudinal direction of the passage unit 4. The number of pressure chambers 10 included in each row gradually decreases from a longer side to a shorter side of the piezoelectric actuator 21, in conformity with an outer shape of the piezoelectric actuator 21. The nozzles 8 are arranged in the same manner as the pressure chambers 10 are, so that as a whole an image can be formed at a resolution of 600 dpi.

Formed within the passage unit 4 are manifold channels 5 acting as common ink chambers and sub manifold channels 5a acting as branch passages of the common ink chambers, as shown in FIG. 3. The manifold channel 5 extends along the oblique side of the piezoelectric actuator 21 and intersects the longitudinal direction of the passage unit 4. Every neighboring piezoelectric actuators 21 share one manifold channel 5. The sub manifold channels 5a branch from both sides of each manifold channel 5. One ink ejection region is opposed to four sub manifold channels 5a that extend in the longitudinal direction of the passage unit 4. Through ink flow-in openings 5b provided on the upper face of the passage unit 4, ink is supplied to the manifold channels 5.

Figure 4:
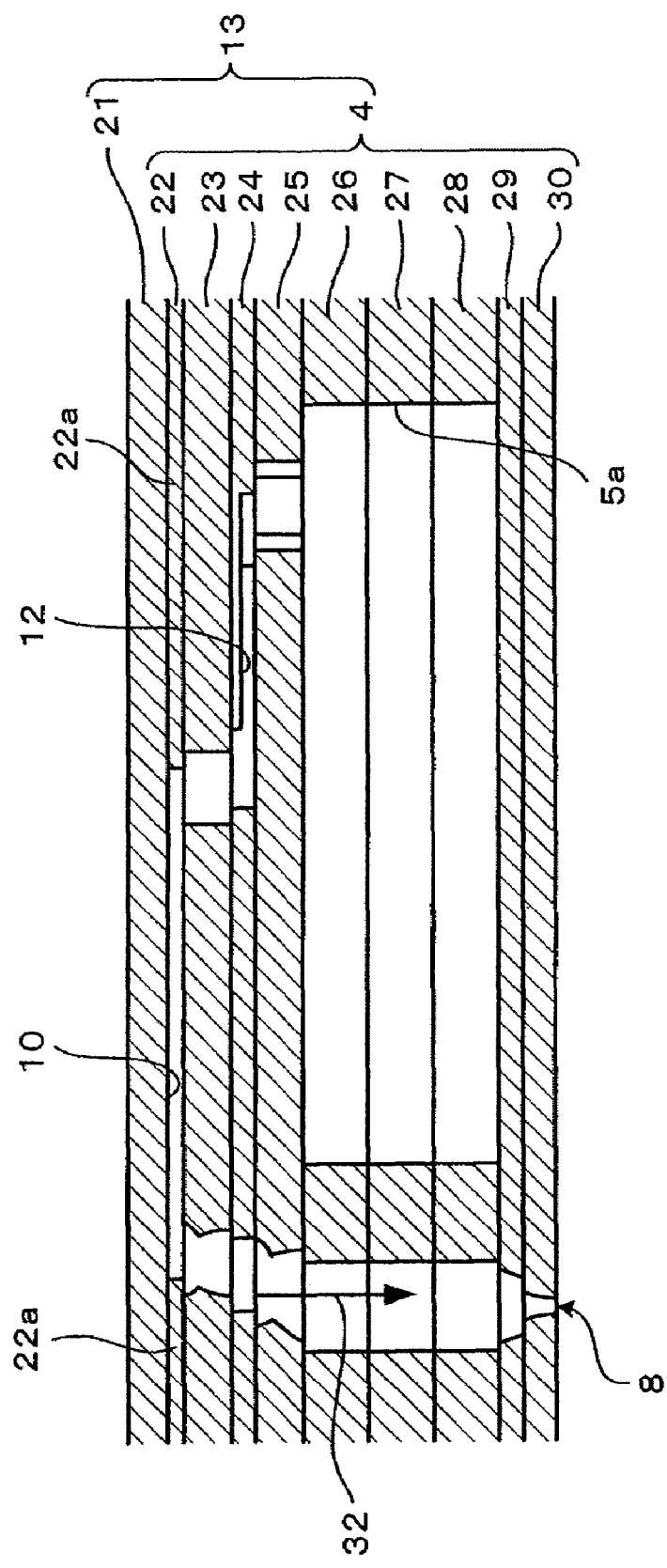
FIG. 4 is a sectional view taken along line IV-IV in FIG. 3.

Each of the nozzles 8 communicates with a sub manifold channel 5a through a pressure chamber 10 having a substantially rhombic shape in a plan view and an aperture 12 acting as a throttle, as shown in FIG. 4. The nozzles 8 form nozzle rows along the longitudinal direction of the passage unit 4. Nozzles 8 included in four neighboring nozzle rows communicate with the same sub manifold channel 5a. Formed within the passage unit 4 are many individual ink passages 32 each extending from an outlet of the sub manifold channel 5a through a pressure chamber 10 to a corresponding nozzle 8. In FIG. 3, for the purpose of easy understanding, the piezoelectric actuators 21 are illustrated with alternate long and two short dashes lines whereas pressure chambers 10 and apertures 12, which locate under the piezoelectric actuators 21 and therefore actually should be illustrated with broken lines, are illustrated with solid lines.

The nozzles 8 are positioned in such a manner that their projective points on an imaginary line extending in the longitudinal direction of the passage unit 4 can be arranged at regular intervals of 600 dpi, when all of them are projected onto the imaginary line in a direction perpendicular to the imaginary line.

Next, a cross-sectional structure of the head main body 13 will be described. FIG. 4 is a sectional view taken along line IV-IV in FIG. 3. As shown in FIG. 4, the passage unit 4 has a layered structure of, from the top, a cavity plate 22, a base plate 23, an aperture plate 24, a supply plate 25, manifold plates 26, 27, 28, a cover plate 29, and a nozzle plate 30.

The cavity plate 22 is a metal plate in which formed are many substantially rhombic holes serving as pressure chambers 10. The base plate 23 is a metal plate in which formed are connection holes each connecting each pressure chamber 10 to a corresponding aperture 12 and connection holes each connecting each pressure chamber 10 to a corresponding nozzle 8. The aperture plate 24 is a metal plate in which formed are holes serving as apertures 12 and connection holes each connecting each pressure chamber 10 to a corresponding nozzle 8. The supply plate 25 is a metal plate in which formed are connection holes each connecting each aperture 12 to a sub manifold channel 5a and connection holes each connecting each pressure chamber 10 to a corresponding nozzle 8. Each of the manifold plates 26, 27, and 28 is a metal plate in which formed are holes constituting sub-manifold channels 5a and connection holes each connecting each pressure chamber 10 to a corresponding nozzle 8. The cover plate 29 is a metal plate in which formed are connection holes each connecting each pressure chamber 10 to a corresponding nozzle 8. The nozzle plate 30 is a metal plate in which formed are many holes serving as nozzles 8. The nine metal plates are positioned in layers so as to form individual ink passages 32.

Figure 5:
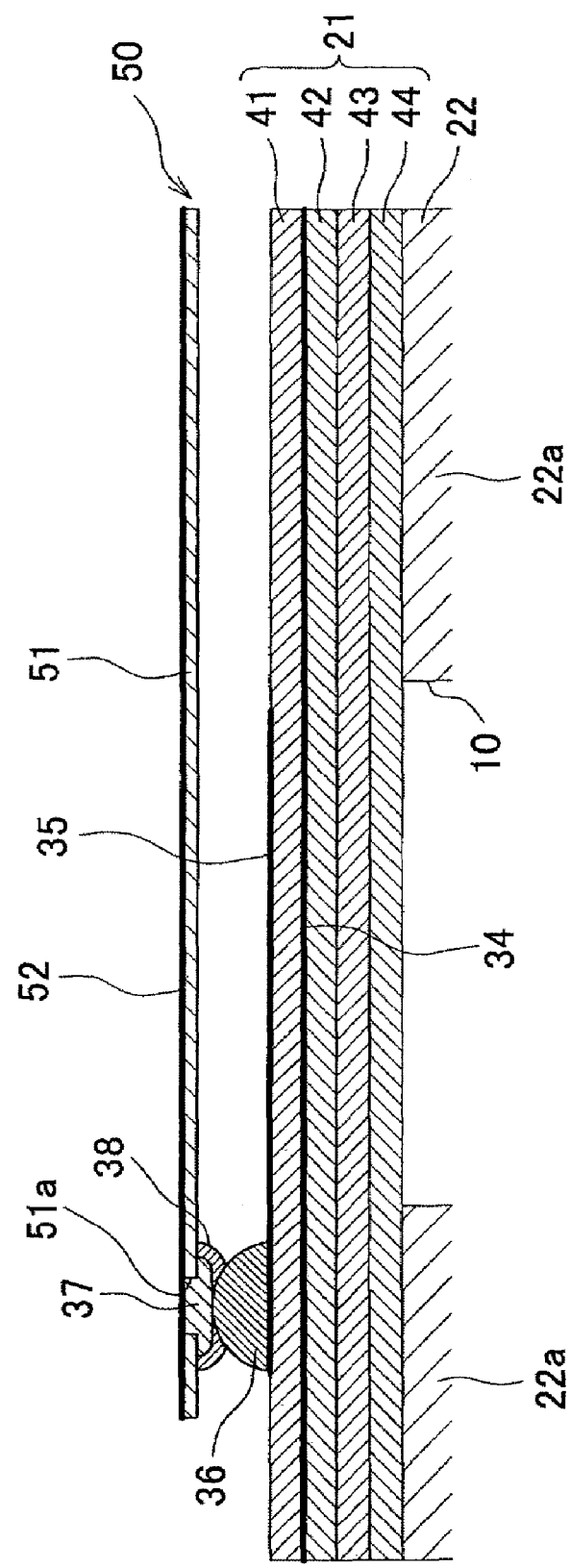
FIG. 5 shows on an enlarged scale a piezoelectric actuator illustrated in FIG. 4.

As shown in FIG. 5, the piezoelectric actuator 21 has four piezoelectric layers 41, 42, 43 and 44 laminated to each other. Each of the piezoelectric layers 41 to 44 has the same thickness of approximately 15 µm, and thus the piezoelectric actuator 21 has a thickness of approximately 60 µm. Any of the piezoelectric layers 41 to 44 extends over many pressure chambers 10 that constitute one pressure chamber group 9. The piezoelectric layers 41 to 44 are made of a lead zirconate titanate (PZT)-base ceramic material having ferroelectricity.

An individual electrode 35 having a thickness of approximately 1 µm is formed on the uppermost piezoelectric layer 41. Both of the individual electrode 35 and a later-described common electrode 34 are made of a metal material such as an Ag—Pd-base one. The individual electrode 35 has a substantially rhombic shape in a plan view. The individual electrode 35 is formed so that it is opposed to the pressure chamber 10 and at the same time its large part falls within the pressure chamber 10 in a plan view. Consequently, substantially throughout a whole area on the uppermost piezoelectric layer 41, many individual electrodes 35 are regularly arranged in two dimensions, as shown in FIG. 3. Since the individual electrodes 35 are formed only on an upper face of the piezoelectric actuator 21, the piezoelectric layer 41 is the only layer that includes active portions. Thereby, the piezoelectric actuator 21 can present unimorph deformation at good efficiency.

An acute portion of each of the individual electrodes 35 close to the longer side of the piezoelectric actuator extends out to a position above a partition wall 22a of the cavity plate 22. The partition wall 22a is bonded to the piezoelectric actuator 21 and supports the piezoelectric actuator 21. That is, the partition wall 22a is a portion of the cavity plate 22 where no pressure chamber 10 is formed. A land 36 having a thickness of approximately 15 µm is provided on the vicinity of an end of this extending-out portion. The individual electrode 35 and the land 36 are electrically bonded to each other. The land 36 is made for example of gold including glass frits. The land 36 electrically connects the individual electrode 35 to a bump 37 that is formed on a lower face of the COF 50.

A common electrode 34 having a thickness of approximately 2 µm is interposed between the uppermost piezoelectric layer 41 and the piezoelectric layer 42 disposed under the uppermost piezoelectric layer 41. The common electrode 34 is formed over an entire face of the layer 41. As a result, the piezoelectric layer 41 is, in its portion opposed to the pressure chamber 10, sandwiched between a pair of electrode made up of the individual electrode 35 and the common electrode 34. No electrode is disposed between the piezoelectric layer 42 and the piezoelectric layer 43. A structure shown in FIG. 5 is provided for every pressure chamber 10. Unillustrated surface electrodes that are electrically connected to the common electrode 34 are formed on a surface of the piezoelectric layer 41. The surface electrodes are disposed at four corners of the piezoelectric actuator 21, respectively, so as to enclose all the individual electrodes 35. In connecting the COF 50 to the piezoelectric actuator 21, the surface electrodes as well as the individual electrodes 35 are connected to corresponding signal wires. The surface electrodes and the common electrode 34 are connected via through holes that are formed through the piezoelectric layer 41.

In order that potentials of respective individual electrodes 35 can independently be controlled, the individual electrodes 35 are electrically connected to a driver IC 49 (see FIG. 6) independently through bumps 37 and drive signal wires 52 of the COF 50 which will be described later. The driver IC 49 individually applies a drive potential to each individual electrode 35. The common electrode 34 is connected to a later-described second signal wire 54 of the COF 50, and kept at a first reference potential functioning as a reference for a drive potential that is supplied to an individual electrode 35.

Figure 6:
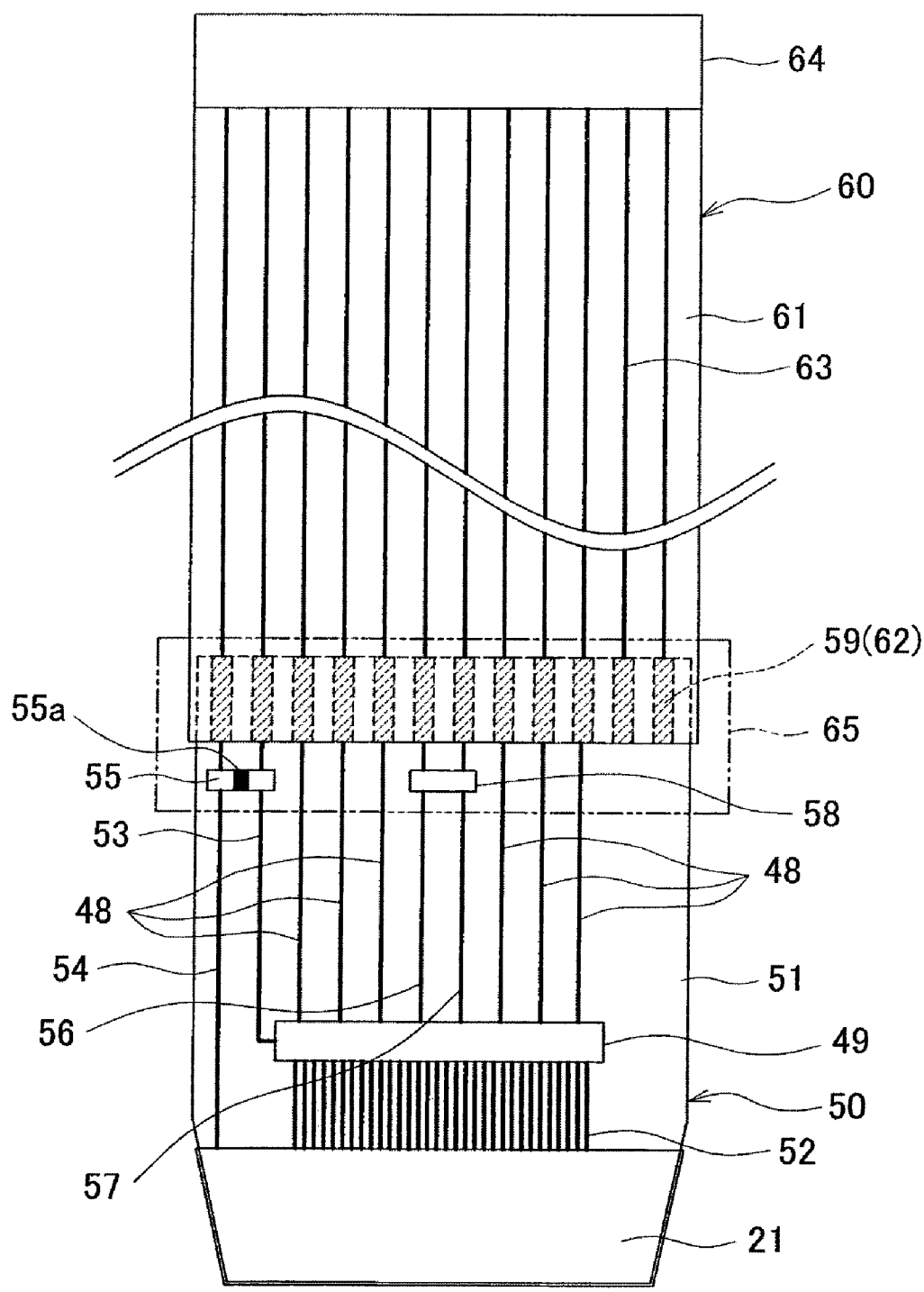
FIG. 6 is a plan view of a COF illustrated in FIG. 5, and an FPC connected to the COF.

The COF 50 is disposed on an upper face of each piezoelectric actuator 21. FIG. 6 is a plan view showing the COF 50 and an FPC 60 connected to the COF 50. In FIG. 6, for the purpose of explanatory convenience, an insulating tape 65 is illustrated with an alternate long and two short dashes line though it locates uppermost, whereas a solder point 55 and a bypass capacitor 58 are illustrated with solid lines though they are covered with the insulating tape 65 and therefore should actually be illustrated with broken lines. As shown in FIG. 2, the respective COF 50 extend from the four actuator units 21 outward along the widthwise direction of the passage unit 4 in such a manner that they do not overlap the ink flow-in openings 5b. As shown in FIGS. 5 and 6, the COF 50 has a substrate 51, a driver IC 49, many drive signal wires 52, a first signal wire 53, a second signal wire 54, a solder point 55, a third signal wire 56, a fourth signal wire 57, a bypass capacitor 58, control signal wires 48, and first contacts 59. The driver IC 49 is mounted on an upper face of the substrate 51. The drive signal wires 52, the first signal wire 53, the second signal wire 54, the solder point 55, the third signal wire 56, the fourth signal wire 57, the bypass capacitor 58, the control signal wires 48, and first contacts 59 are formed on the upper face of the substrate 51. The drive signal wires 52, the first signal wire 53, the second signal wire 54, the third signal wire 56, the fourth signal wire 57, and the control signal wires 48 correspond to signal wires of the present invention.

The substrate 51 is a sheet member made of an insulating material such as a synthetic resin. As shown in FIG. 5, the substrate 51 has a through hole 51a in its portion overlapping the land 36 in a plan view. A bump 37 electrically connected to the drive signal wire 52 is provided in the through hole 51a and also at a periphery of the through hole 51a on a lower face of the substrate 51. A solder 38 is provided on a lower face of the bump 37. The land 36 and the bump 37 are connected through the solder 38, so that the individual electrode 35 is electrically connected to the drive signal wire 52 and at the same time the COF 50 is fixed to the piezoelectric actuator 21. The substrate 51 has a through hole also in its portion overlapping a land that is provided on the surface electrode. A bump electrically connected to the second signal wire 54 is provided in the through hole and at a periphery of the through hole on the lower face of the substrate 51. In the same manner as described above, the bump and the land are connected through a solder so that the common electrode 34 is electrically connected to the second signal wire 54.

The driver IC 49 generates a drive potential and a first reference potential. The drive potential is supplied to the individual electrode 35, and the first reference potential is supplied to the common electrode 34. The drive signal wires 52 are connected to the driver IC 49. Each of the drive signal wires 52 extends from the driver IC 49 toward the piezoelectric actuator 21, and is connected to a corresponding bump 37 as shown in FIG. 5. A drive potential generated by the driver IC 49 is selectively supplied to an individual electrode 35 through a bump 37 and a land 36.

The first signal wire 53 is also connected to the driver IC 49. The first signal wire 53 is kept at the first reference potential. The first signal wire 53 extends from the driver IC 49 along a left end of the COF 50 in FIG. 6, and is electrically connected to one of the contacts 59. The second signal wire 54 extends from the piezoelectric actuator 21 along the left end of the COF 50 in FIG. 6. One end of the second signal wire 54 is electrically connected to two surface electrodes formed near the two left corners of the piezoelectric actuator 21 in FIG. 6, respectively. The other end of the second signal wire 54 is electrically connected to one of the contacts 59. An FPC 60 can set the second signal wire 54 at a predetermined potential lower than the first reference potential. Near the contacts 59, the first signal wire 53 and the second signal wire 54 neighbor each other. The solder point 55 is disposed across the first and second signal wires 53 and 54 that neighbor each other near the contacts 59. A solder 55a is provided substantially at a center of the solder point 55. The solder 55a short-circuits the first and second signal wires 53 and 54. An upper face of the solder point 55 is a conductive part, and exposed on the upper face of the substrate 51.

When manufacturing the ink-jet head 2 and before providing the solder 55a on the solder point 55, the common electrode 34 is set at the predetermined potential through the second signal wire 54 while a drive potential is supplied to the individual electrode 35 through the drive signal wire 52. As a consequence, a voltage that can polarize the piezoelectric layer 41 is applied to the electrodes 34 and 35. That is, a voltage larger than in driving the piezoelectric actuator 21 is applied to the piezoelectric layer 41. After the piezoelectric layer 41 is polarized in this way, the solder 55a is provided on the solder point 55, so that the common electrode 34 is kept at the first reference potential through the first and second signal wires 53 and 54. When driving the piezoelectric actuator 21, a potential of the individual electrode 35 is switched alternately between the first reference potential and the drive potential that is higher than the first reference potential, while the common electrode 34 is kept at the first reference potential. At the time when the potential of the individual electrode 35 is switched from the drive potential to the first reference potential, electric charges hitherto accumulated in the piezoelectric actuator 21 are discharged. A discharge current caused at this time flows sequentially through the second signal wire 54, the solder point 55, and the first signal wire 53, then reaches the driver IC 49. This path is shorter than a path not including the solder point 55, such as a path extending to the driver IC 49 via an external printed board (not shown) connected to the FPC 60. In this embodiment, the first and second signal wires 53 and 54 are short-circuited at the solder point 55. Thus, the length of a loop circuit including the common electrode 34, the solder point 55 and the driver IC 49 becomes shorter than when the first and second signal wires 53 and 54 are short-circuited on the printed board connected to the FPC 60. Therefore, it is less likely that noise is caused by the discharge current that flows through the loop circuit. This can prevent in advance malfunction of adjacent circuit components. In addition, the loop circuit does not include a junction between the contact 59 and a later-described second contact 62. Accordingly, even when resistance of the junction varies among the four piezoelectric actuators 21, the first reference potential supplied to the common electrode 34 does not easily vary and therefore ink ejection performance is stable.

The third signal wire 56 and the fourth signal wire 57 are also connected to the driver IC 49. The third signal wire 56 extends from the driver IC 49 upward in FIG. 6, and is electrically connected to one of the contacts 59. The fourth signal wire 57 neighbors the third signal wire 56 and extends from the driver IC 49 upward in FIG. 6. The fourth signal wire 57 is electrically connected to one of the contacts 59. The fourth signal wire 57 is connected through the FPC 60 to the printed board, and kept at a second reference potential that functions as a reference for a power supply voltage. The power supply voltage is supplied to the third signal wire 56. The bypass capacitor 58 is disposed across the third and fourth signal wires 56 and 57 near the contacts 59. The bypass capacitor 58 electrically connects the third and fourth signal wires 56 and 57 to each other. The bypass capacitor 58 suppresses noise that is included in the power supply voltage. A terminal of the bypass capacitor 58, which is a conductive part, is partially exposed on the upper face of the substrate 51.

The control signal wires 48 are also connected to the driver IC 49. The respective control signal wires 48 extend from the driver IC 49 upward in FIG. 6, and are electrically connected to the contacts 59. As will be described later, the printed board supplies a control signal to the driver IC 49 through the FPC 60 and the control signal wire 48. The contacts 59 are formed along an upper end of the substrate 51 in FIG. 6. As described above, the contacts 59 are electrically connected to the signal wires 48, 53, 54, 56, and 57. The contact 59 and the contact 62 are electrically connected, thereby connecting the COF 50 and the FPC 60 to each other.

The FPC 60 has a substrate 61, contacts 62, wires 63, and a connector 64. The contacts 62, the wires 63, and the connector 64 are formed on an upper face of the substrate 61. Like the substrate 51, the substrate 61 is a sheet member made of an insulating material such as a synthetic resin. The contacts 62 are formed along a lower end of the substrate 61 in FIG. 6, and electrically connected to the respective contacts 59. Each of the wires 63 has one end thereof connected to the contact 62 and the other end thereof connected to the connector 64. The wires 63 include a wire for supplying the above-mentioned predetermined potential to the common electrode 34 through the contacts 59, 62 and the second signal wire 54 in order to polarize the piezoelectric layer 41, a wire for supplying a control signal to the driver IC 49 through the contacts 59, 62 and the second signal wire 48. The connector 64 is provided at an upper end of the substrate 61 in FIG. 6. The FPC 60 is connected through the connector 64 to the printed board. The above-mentioned predetermined potential, the power supply voltage for the driver IC 49, the control signal are supplied from the printed board to the wires 63.

The corresponding contacts 59 and 62 are disposed so as to overlap each other in a plan view, and electrically connected to each other by a solder or the like. A junction between the contacts 59 and 62 is covered with the insulating tape 65 and therefore not exposed. The solder point 55 and the bypass capacitor 58 which are disposed near the contacts 59 and 62 are also covered with the insulating tape 62 and therefore not exposed.

Here, an operation of the piezoelectric actuator 21 will be described. Among the four piezoelectric layers 41 to 44 shown in FIG. 5, only the piezoelectric layer 41 is polarized in a direction oriented from the individual electrode 35 toward the common electrode 34. Upon every ejection request, the driver IC 49 gives a drive potential to an individual electrode 35, so that a potential difference occurs in a portion of the piezoelectric layer 41 sandwiched between the individual electrode 35 thus given the drive potential and the common electrode 43 kept at the first reference potential, that is, in an active portion of the piezoelectric layer 41. At this time, an electric field in a thickness direction of the piezoelectric layer 41 is generated in the active portion of the piezoelectric layer 41. By a transversal piezoelectric effect, the active portion of the piezoelectric layer 41 contracts in a direction perpendicular to a polarization direction. The other piezoelectric layers 42 to 44 do not contract because the electric field is not applied thereto. As a result, portions of the piezoelectric layers 41 to 44 opposed to the active portion as a whole present unimorph deformation protruding toward a corresponding pressure chamber 10. The volume of the pressure chamber 10 decreases accordingly, and ink contained in the pressure chamber 10 rises in pressure so that ink is ejected from a corresponding nozzle 8 (see FIG. 4). Then, at a predetermined timing, the individual electrode 35 returns to the first reference potential. Thus, the piezoelectric layers 41 to 44 restore their original flat shapes, and the pressure chamber 10 restores its original volume. At this time, ink is sucked from a sub manifold channel 5a into an individual ink passage 32.

In another possible driving mode, a drive potential is in advance given to an individual electrode 35. Upon every ejection request, the individual electrode 35 is set at the first reference potential and then at a predetermined timing given the drive potential again. In this mode, in an initial state where the drive potential is in advance given to the individual electrode 35, a portion of the piezoelectric layers 41 to 44 corresponding to an active portion has already deformed protrudingly toward a corresponding pressure chamber 10. Then, at a timing of setting the individual electrode 35 at the first reference potential, the piezoelectric layers 41 to 44 are formed into a flat shape, so that the volume of the pressure chamber 10 becomes larger than in the initial state to thereby suck ink from a sub manifold channel 5b into an individual ink passage

32. Then, at a timing of giving the drive potential again to the individual electrode 35, the portion of the piezoelectric layers 41 to 44 corresponding to the active portion deforms protrudingly toward the corresponding pressure chamber 10. The volume of the pressure chamber 10 decreases accordingly, and ink contained in the pressure chamber 10 rises in pressure so that ink is ejected from a corresponding nozzle 8.

In this embodiment, as thus has been described above, the inexpensive FPC 60 not mounted with the driver IC 49 is connected to the expensive COF 50 mounted with the driver IC 49. In this case, by connecting the FPC 60 to a printed board, a length of the COF 50 can be shortened. Manufacturing costs of the ink-jet head 2 can thereby be suppressed.

In addition, since the solder point 55 and the bypass capacitor 58 are provided near the contacts 59, the contacts 59, 62 and circuit components such as the solder point 55 and the bypass capacitor 58 can together be covered with the insulating tape 65. This can prevent the solder point 55 and/or the bypass capacitor 58 from being short-circuited to a wire or another circuit component and thus causing damage to the COF 50.

Since the solder point 55 is provided on the COF 50, the loop circuit including the common electrode 34, the solder point 55 and the driver IC 49 does not include the contacts 59 and 62. Although resistance of the junction between the contacts 59 and 62 may vary, variation in ink ejection performance can be suppressed because the loop circuit does not include the contacts 59 and 62. Moreover, the loop circuit has a short length, it is less likely that noise is caused.

Figure 7:
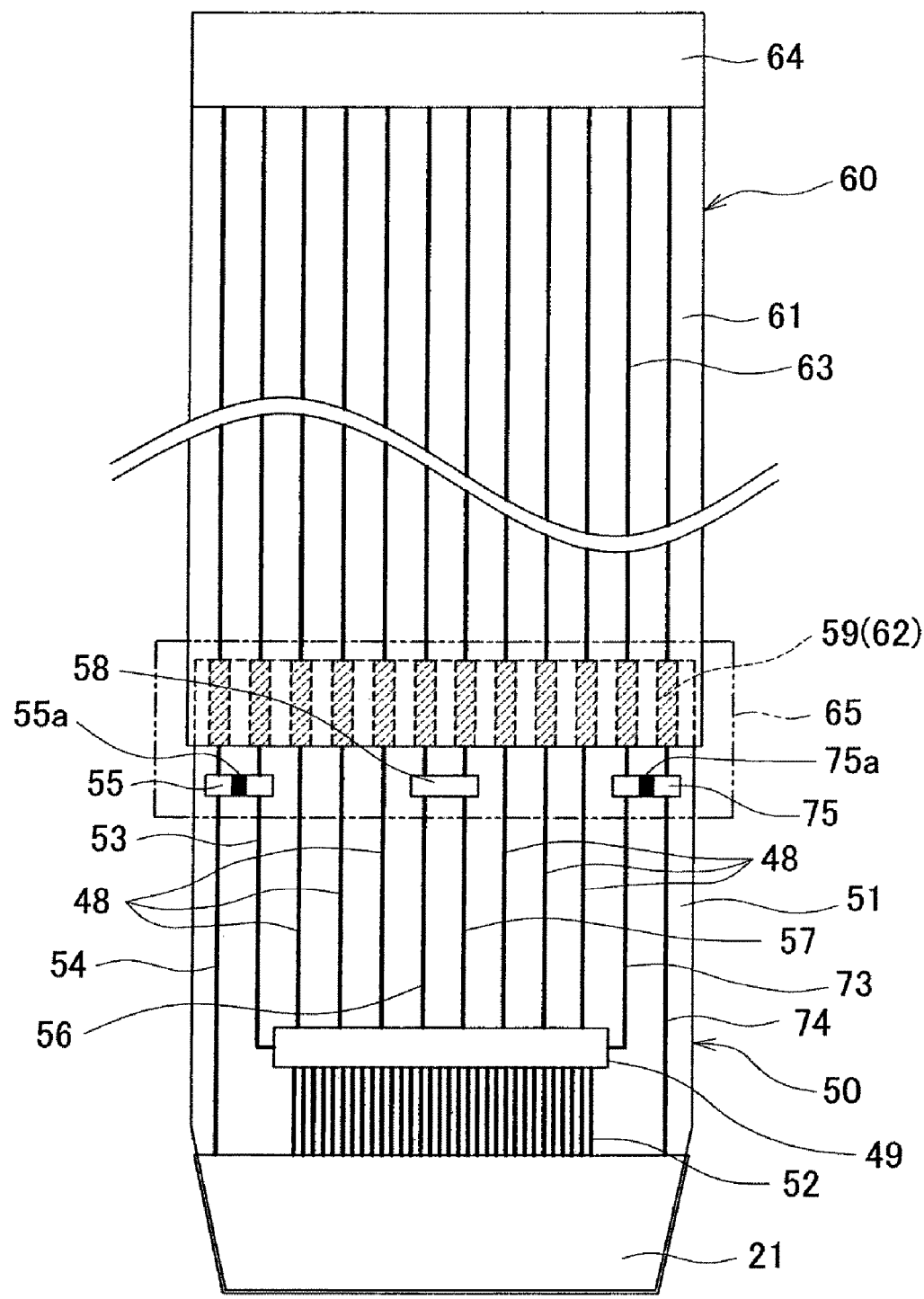
FIG. 7 is a plan view showing a modification in correspondence with FIG. 6.

Next, a modification of the above-described embodiment will be described with reference to FIG. 7. In the following, the same members as in the above-described embodiment will be denoted by the common reference numerals, without a specific description thereof.

In this modification, a first signal wire 73 and a second signal wire 74 are provided in addition to the first and second signal wires 53 and 54. That is, there are two pairs of first and second signal wires. The pair of first and second signal wires 73 and 74 is disposed at a distance from the pair of first and second signal wires 53 and 54, and the two pairs are disposed symmetrically to each other with respect to the piezoelectric actuator 21. Like the first signal wire 53, the first signal wire 73 is connected to the driver IC 49, and kept at the first reference potential. One end of the second signal wire 74 is electrically connected to two surface electrodes formed near the two right corners of the piezoelectric actuator 21 in FIG. 7, respectively. The other end of the second signal wire 74 is electrically connected to one of the contacts 59. Near the contacts 59, the first signal wire 73 and the second signal wire 74 neighbor each other. A solder point 75 short-circuits the first and second signal wires 73 and 74. Like the solder point 55, the solder point 75 also has a solder 75a provided substantially at a center thereof. Thus, the pair of first and second signal wires 53 and 54, and the pair of first and second signal wires 73 and 74 are disposed at both ends of the COF 50 with respect to a direction perpendicular to a direction in which the COF 50 extends out from the piezoelectric actuator 21, that is, with respect to a down-to-up direction along the drawing sheet of FIG. 7 which is perpendicular to a horizontal direction in FIG. 7.

The second signal wires 54 and 74 are connected to the surface electrodes that are provided near the four corners of the piezoelectric actuator 21. Therefore, a whole of the common electrode 34 can be held equally at the first reference potential, to thus suppress variation in performance of ink ejection from nozzles 8 (see FIG. 4). In addition, the pair of the first and second signal wires 53 and 54 is disposed along a left end of the COF 50, while the pair of the first and second signal wires 73 and 74 is disposed along a right end of the COF 50. The signal wires 53, 54, 73, and 74 are held at the first reference potential. This can improve electrical shielding of the COF 50. Like the solder point 55, the solder point 75 is not provided with the solder 75a until the piezoelectric layer 41 is polarized. The solder 75a is provided after the piezoelectric layer 41 is polarized.

The number of pairs of the first and second signal wires is not limited to one as in the above-described embodiment and two as in the above-described modification, and it may be three or more. In such a case, second signal wires included in the respective pairs are connected to different portions of the common electrode 34, so that a whole of the common electrode 34 can be held equally at the first reference potential.

In the above-described embodiment, the solder point 55 and the bypass capacitor 58 are adopted as circuit components, but this is not limitative. For example, it may be possible that an arbitrary circuit component having its conductive part exposed is disposed near the contacts 59 on the COF 50 and is, together with the contacts 59 and 62, covered with the insulating tape 65.

In the above-described embodiment, the individual electrodes 35 are formed on the uppermost piezoelectric layer 41, while the common electrode 34 is formed between the piezoelectric layer 41 and the piezoelectric layer 42 disposed under the piezoelectric layer 41 in such a manner that the common electrode 34 is opposed to the individual electrodes 35 across the piezoelectric layer 41. However, this is not limitative. For example, the individual electrodes 35 may be formed not on the piezoelectric layer 41 but on a surface of any of the piezoelectric layers 42 to 44, while the common electrode 34 may be formed between the piezoelectric layers 42 and 43 or between the piezoelectric layers 43 and 44. That is, there is no particular limitation on where in the piezoelectric actuator 21 the individual electrodes 35 and the common electrode 34 are disposed.

The above-described ink-jet printer 1 is a line printer having the fixed heads 2, but the present invention is applicable to a serial printer having a reciprocating head, too.

Applications of the ink-jet head according to the present invention are not limited to printers. It is also applicable to facsimiles, copying machines, and the like.

While this invention has been described in conjunction with the specific embodiments outlined above, it is evident that many alternatives, modifications and variations will be apparent to those skilled in the art. Accordingly, the preferred embodiments of the invention as set forth above are intended to be illustrative, not limiting. Various changes may be made without departing from the spirit and scope of the invention as defined in the following claims.

What is claimed is:

1. An ink-jet head comprising:
a passage unit having a pressure chamber that communicates with an ink ejection port;
a piezoelectric actuator that applies pressure to ink in the pressure chamber, and has a piezoelectric member including one or more piezoelectric layers, an individual electrode formed corresponding to the pressure chamber, and a common electrode formed corresponding to the individual electrode, at least one piezoelectric layer being sandwiched between the individual electrode and the common electrode;
a first wire member connected to the piezoelectric actuator and having a driver IC that supplies a drive potential to the piezoelectric actuator; and
a second wire member connected to the first wire member and having a plurality of supply wires including a control signal supply wire that supplies a control signal to the driver IC;

wherein:
the first wire member includes a first substrate, a plurality of signal wires, the driver IC connected to the signal wires, a circuit component that electrically connects two or more of the signal wires and has its conductive part exposed, and a plurality of first contacts connected to the respective signal wires;
the second wire member includes a second substrate, the supply wires, and a plurality of second contacts connected to the respective supply wires;
the corresponding first and second contacts are connected to each other;
the circuit component is disposed near any of the first contacts; and
all of the first and second contacts, and the circuit component are covered with an insulating tape.

2. The ink-jet head according to claim 1, wherein:
the signal wires include a first signal wire connected to the driver IC and a second signal wire connected to the common electrode, the first signal wire being supplied with a signal that sets the common electrode at a first reference potential functioning as a reference for the drive potential, the second signal wire being supplied with a signal that, for polarizing the piezoelectric member, sets the common electrode at a predetermined potential lower than the first reference potential;
the first signal wire and the second signal wire neighbor each other in the vicinity of any of the first contacts; and
the circuit component is a solder point that is disposed near the first contact in the vicinity of which the first signal wire and the second signal wire neighbor each other, and short-circuits the first signal wire and the second signal wire to each other.

3. The ink-jet head according to claim 2, wherein:
when the first signal wire and the second signal wire are made into a set, the first wire member has a plurality of sets that are distant from one another; and
the second signal wires included in the respective sets are connected to different portions of the common electrode.

4. The ink-jet head according to claim 3, wherein:
the first wire member has two sets of the first signal wire and the second signal wire; and
the two sets are disposed respectively along both ends of the first wire member with respect to a direction perpendicular to a direction in which the first wire member extends out from the piezoelectric actuator.

5. The ink-jet head according to claim 1, wherein:
the signal wires include a third signal wire and a fourth signal wire both connected to the driver IC, the third signal wire supplying a power source voltage to the driver IC, the fourth signal wire being kept at a second reference potential functioning as a reference for the power source voltage;
the third signal wire and the fourth signal wire neighbor each other in the vicinity of any of the first contacts; and
the circuit component is a bypass capacitor that is disposed near the first contact in the vicinity of which the third signal wire and the fourth signal wire neighbor each other, and electrically connects the third signal wire and the fourth signal wire to each other.

* * * * *